United States Patent

Oh

[19]

[11] Patent Number: 6,100,748

[45] Date of Patent: Aug. 8, 2000

[54] REDUNDANT CIRCUIT FOR SEMICONDUCTOR DEVICE HAVING A CONTROLLABLE HIGH VOLTAGE GENERATOR

[75] Inventor: Young Nam Oh, Kyoungki-do, Rep. of Korea

[73] Assignee: Hyundai Electronics Industries Co., Ltd., Ichon-shi, Rep. of Korea

[21] Appl. No.: 09/105,276

[22] Filed: Jun. 26, 1998

[30] Foreign Application Priority Data

Jun. 26, 1997 [KR] Rep. of Korea .................. 97-27721

[51] Int. Cl.[7] ................................................. G06F 11/16
[52] U.S. Cl. ........................ 327/526; 327/525; 327/544; 365/96; 365/227
[58] Field of Search .......................... 327/525, 526, 327/530, 536, 538, 544; 365/96, 185.09, 226, 227

[56] References Cited

U.S. PATENT DOCUMENTS

| 4,695,745 | 9/1987 | Mimoto et al. ............... 307/297 |
|---|---|---|
| 5,038,368 | 8/1991 | Lee ............................. 327/526 |
| 5,410,510 | 4/1995 | Smith et al. ................. 365/201 |
| 5,877,992 | 3/1999 | Wu et al. ..................... 365/200 |
| 5,907,513 | 3/1999 | Kato ............................. 365/96 |
| 5,909,142 | 6/1999 | Kawasaki et al. ........... 327/525 |

*Primary Examiner*—Jung Ho Kim
*Attorney, Agent, or Firm*—Jacobson, Price, Holman & Stern, PLLC

[57] ABSTRACT

A redundant circuit for a semiconductor device including a fuse program means producing a control signal determining whether or not a chip is normal; a high-voltage generating means producing a first voltage or second voltage according to a control signal from the fuse program means; and an on-chip redundant decoding means driven by the first voltage or second voltage produced from the high-voltage generating means. In case that the chip is normal, the high-voltage generating means generates the first voltage, and in case that the chip fails, the high-voltage generating means produces the second voltage. The first voltage is an output voltage from the high-voltage generating means, and the second voltage is an output voltage higher than the first voltage.

2 Claims, 6 Drawing Sheets

REDUNDANT CIRCUIT FOR SEMICONDUCTOR DEVICE HAVING A CONTROLLABLE HIGH VOLTAGE GENERATOR

BACKGROUND OF THE INVENTION

1. Field of the Invention

The present invention relates generally to a redundant circuit for a semiconductor device. More particularly, it relates to a redundant circuit for a semiconductor device capable of controlling the operation of a high-voltage generator that has been already used in response to a determination whether or not a chip is normal.

2. Description of the Related Art

If any one of multiple microscopic cells, constituting a dynamic random access memory (DRAM) or synchronous memory device, fails, the DRAM cannot perform a normal function. This case employs the redundant structure which has an advantageous yield aspect by replacing the defective cell with an extra memory cell provided in the DRAM or synchronous memory device.

In the redundant structure, redundancy cells of a memory are arranged by sub-array blocks. In case of a 16M DRAM, extra row and column are provided in advance at every 256K cell array, and if one memory cell fails, the other (redundancy cell) will be available for circuit operation in the unit of row/column.

In other words, if the wafer process is completed, its internal circuit is programmed to change to an address signal of the redundancy cell. Accordingly, if there is an input of an address corresponding to the failed line during actual use, a selection is changed to an extra line. This program is characterized as an electric fuse technique by which a fuse is melted with overcurrent to be cut and a laser-beam technique by which a fuse is burned by laser beam.

If power is applied to a high-voltage generator provided in a normal chip (memory cell) and a repair chip, it is always actuated. Thus, if only the normal chip is operated, the unnecessary power loss occurs.

More specifically, in case of the normal chip, fuse blowing for repairs is not made, and a repair address enable pass is shut off. Even if a high-voltage generator relating to the repair address generation only maintains a lower voltage (about Vcc–Vt: the level of precharged voltage applied prior to actuating a charge pump at the time of applying the power thereto if a ring oscillator of the high voltage generator is disabled) than a high voltage (e.g. over 1.5 Vcc), there is no problem with the high-voltage generator in voltage. If the power is applied, the high-voltage generator maintains its operating state all the time, which causes unnecessary power consumption.

SUMMARY OF THE INVENTION

The present invention is directed to a redundant circuit for a semiconductor device which substantially obviates the above-described problem due to limitations and disadvantages of the related art.

It is an object of the present invention to provide a redundant circuit for a semiconductor device which determines whether a chip is normal or not and in case of a normal chip, the already used high voltage generator is disabled, thus preventing the unnecessary power consumption during standby.

In order to realize the above objects, the present invention provides a redundant circuit for a semiconductor device including a fuse program means producing a control signal determining whether or not a chip is normal; a high-voltage generating means producing a first voltage or second voltage according to a control signal from the fuse program means; and an on-chip redundant decoding means driven by the first voltage or second voltage produced from the high-voltage generating means. In case that the chip is normal, the high-voltage generating means generates the first voltage, and in case that the chip fails, the high-voltage generating means produces the second voltage. The first voltage is an output voltage from the high-voltage generating means, and the second voltage is an output voltage higher than the first voltage.

The high-voltage generating means includes a high-voltage level detector sensing a high voltage level in response to the control signal output from the fuse program means; a ring oscillator receiving a signal output from the high-voltage level detector to produce an oscillation signal; and a charge pump generating a high voltage pumped out by the oscillation signal produced from the ring oscillator. The high voltage produced from the charge pump is the second voltage.

BRIEF DESCRIPTION OF THE DRAWINGS

FIGS. 6a to 6h are timing diagrams of the charge pump part of FIG. 1; and

DETAILED DESCRIPTION OF THE PREFERRED EMBODIMENT

Reference will now be made in detail to the preferred embodiment of the present invention, examples of which are illustrated in the accompanying drawings.

Figure 1:
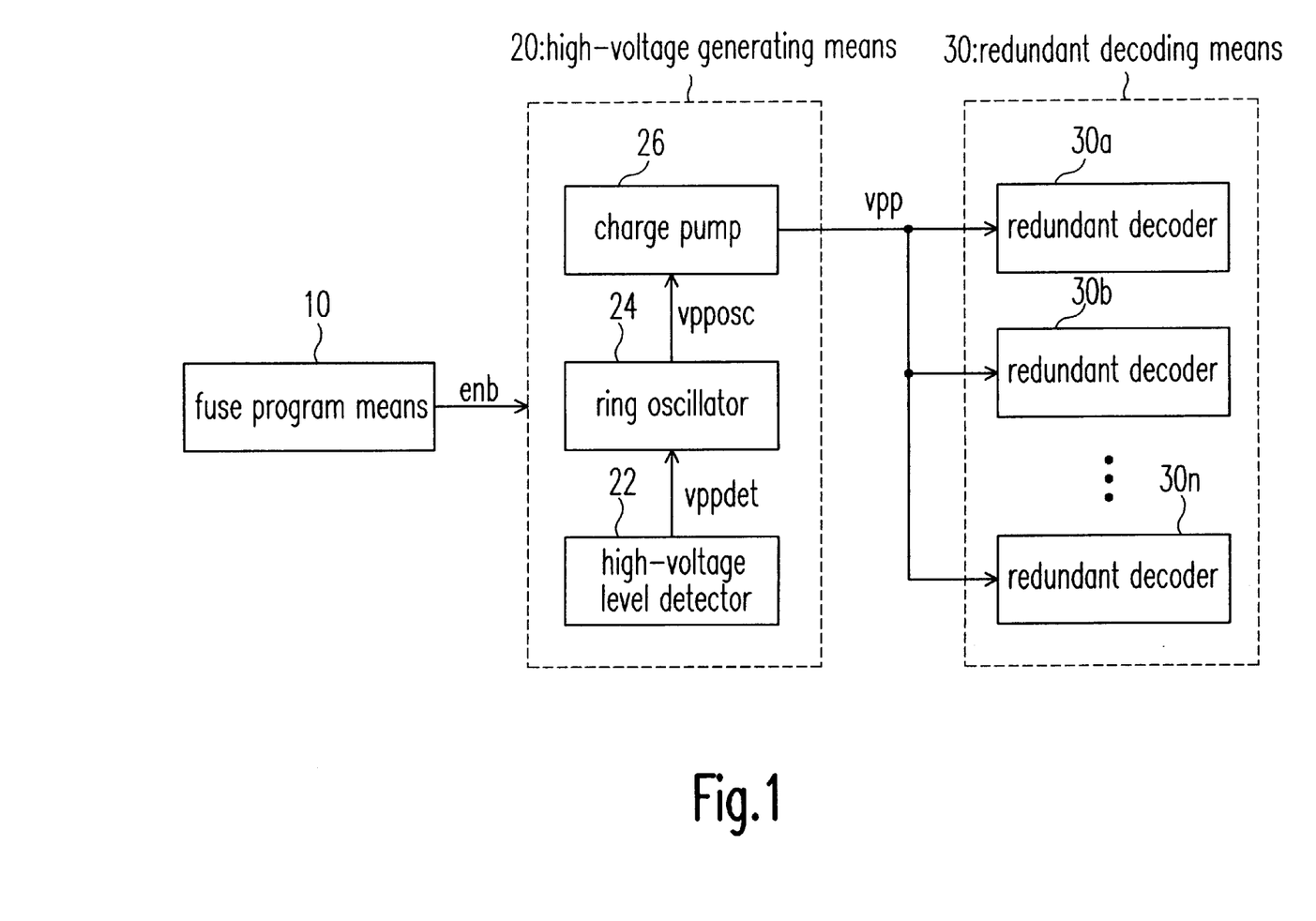
FIG. 1 is a block diagram of a redundant circuit for a semiconductor device in accordance with a preferred embodiment of the present invention.

As shown in FIG. 1, a redundant circuit for a semiconductor device includes a fuse program means 10 which outputs a control signal enb in response to a determination whether or not a chip is normal; a high-voltage generating means 20 that performs a high-voltage generation in response to the control signal output from fuse program means 10; and an on-chip redundant decoding means 30 which has a plurality of redundant decoders 30a to 30n and operates according to the enabling state of high-voltage generating means 20.

Figure 2:
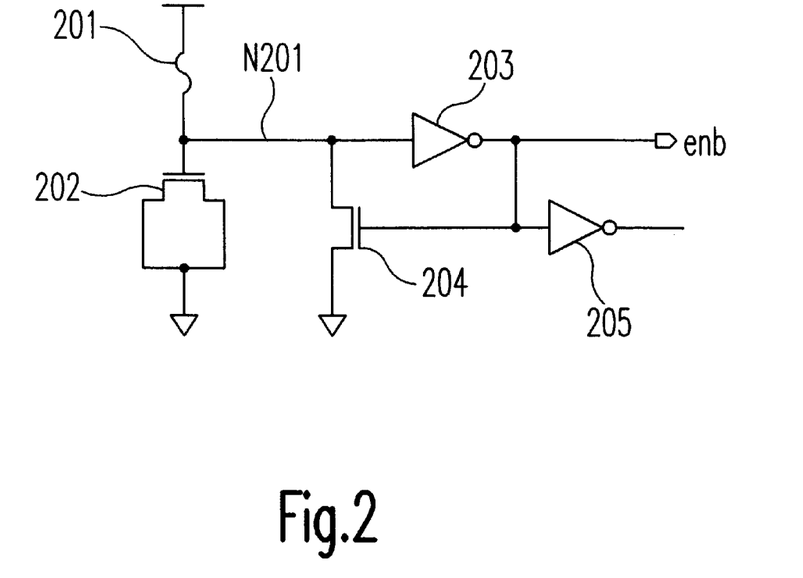
FIG. 2 is a circuit diagram of a fuse program means of FIG. 1.

As shown in FIG. 2, fuse program means 10 has a fuse 201 and a capacitor 202 connected to each other in series between Vcc and ground; a first inverter 203 which is connected between fuse 201 and capacitor 202 and produces a control signal enb (an inverted output of a fuse condition detecting signal); an NMOS transistor 204 coupled between ground and node N201 of fuse 201 and capacitor 202 and first inverter 203; and a second inverter 205 having an input terminal connected to first inverter 203's output terminal and NMOS transistor 204's gate terminal, thus producing a shift signal of a fuse condition detecting signal.

High-voltage generating means 20 includes a high-voltage level detector 22 which produces a turned-on or turned-off signal of a charge pump 26 by sensing the level of high voltage Vpp; a ring oscillator 24 which produces a corresponding oscillation signal upon application of a signal output from high-voltage level detector 22; charge pump 26 which produces a high voltage by the pumping operation in response to the oscillation signal of ring oscillator 24.

Figure 3:
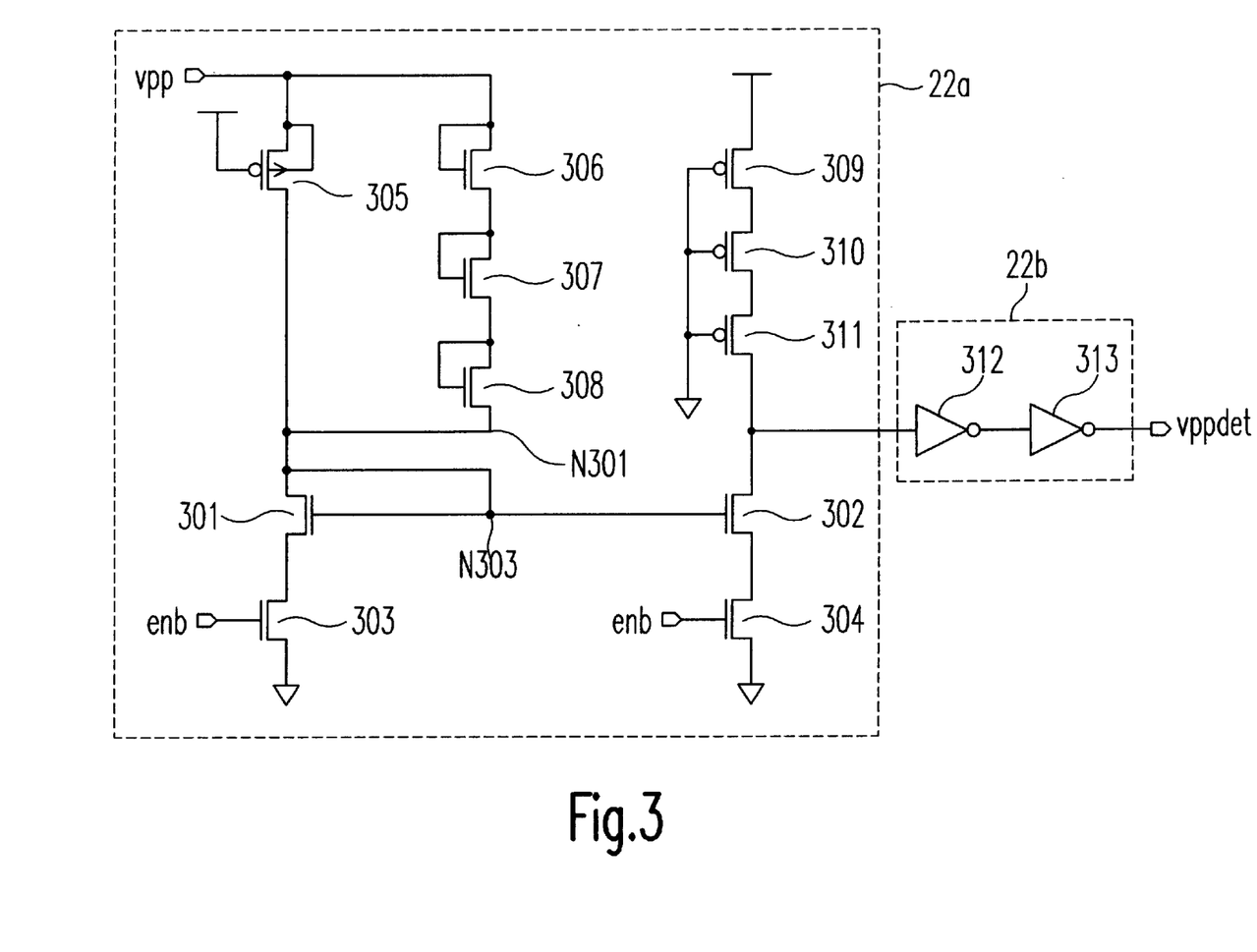
FIG. 3 is a circuit diagram of a high-voltage level detector in a high-voltage generating means of FIG. 1.

Preferably, high-voltage generating means 20 maintains an initially-precharged voltage (Vcc–Vt; Vt denotes a threshold voltage) when the control signal enb, output from fuse program means 10, is indicative of a normal chip. High-voltage generating means 20, as shown in FIG. 3, includes a sensing part 22a which senses the high-voltage level, and a driver 22b which transmits a signal of sensing part 22a to ring oscillator 24 (will be described later).

Sensing part 22a consists of a plurality of NMOS transistors 301 and 302 connected to each other in current mirror type of a differential amplifier; NMOS transistors 303 and 304 between NMOS transistors 301 and 302 and ground and each having a gate terminal connected to control signal output terminal enb of fuse program means 10; a PMOS transistor 305 between NMOS transistor 301's drain and high voltage terminal Vpp and having a gate terminal connected to the power supply voltage; a plurality of diode NMOS transistors 306, 307 and 308 connected in series between NMOS transistor 301's drain terminal and high voltage terminal Vpp; and a plurality of PMOS transistors 309, 310 and 311 each having a gate terminal connected to ground, and connected to each other in series between the power supply voltage and NMOS transistor 302's drain terminal.

PMOS transistor 305 applies a given electric current to a node N301 between NMOS transistors 301 and 308, thus preventing floating of node N301.

Serially connected NMOS transistors 306, 307 and 308 transmit a high voltage to node N301, and if the voltage level is higher than a potential of node N301, they are turned on to apply the electric current to node N301. A plurality of PMOS transistors 309, 310 and 311 apply the electric current by Vcc to a node N302. Driver 22b consists of a plurality of inverters 312 and 313 connected to node N302 in series, and the condition of sensing part 22a is transmitted to a final output terminal vppdet.

If it is a repair chip as to the operation of high voltage generating means 20, i.e. the control signal enb from fuse program means 10 attains a high level, the logic level condition is determined by output signal vppdet by comparing a difference of the currents each flowing to nodes N301 and N302 of NMOS transistors 301 and 302 of current mirror to establish a high potential.

In case that voltage Vpp is low (Vn301<Vn302), output signal vppdet attains a high level, and if voltage Vpp is high (Vn301>Vn302), output signal vppdet attains a low level.

Figure 4:
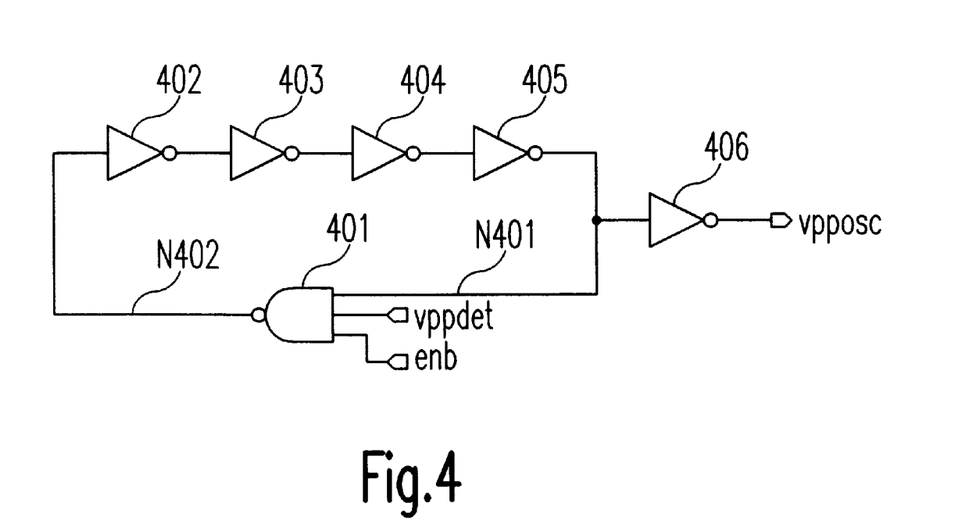
FIG. 4 is a circuit diagram of a ring oscillator in the high-voltage generating means of FIG. 1 in accordance with the present invention.

In FIG. 4, Ring oscillator 24 in high-voltage generating means 20, as time delay means connected in a chain shape, is connected midway of a plurality of inverters 402, 403, 404 and 405, thus forming a chain-like connecting structure, and includes a NAND gate 401 that receives a signal (i.e. enb, vppdet) of a ring oscillator critical path to determine a periodic pulse enabling or disabling, and an inverter 406 having an input terminal connected to a node N401 between inverter 405 and NAND gate 401 to produce a final output signal vpposc. A plurality of inverters 402, 403, 404 and 405 of chain coupling structure send periodically pulse signals to a final output node (i.e. vpposc node) according to NAND gate 401.

Figure 5:
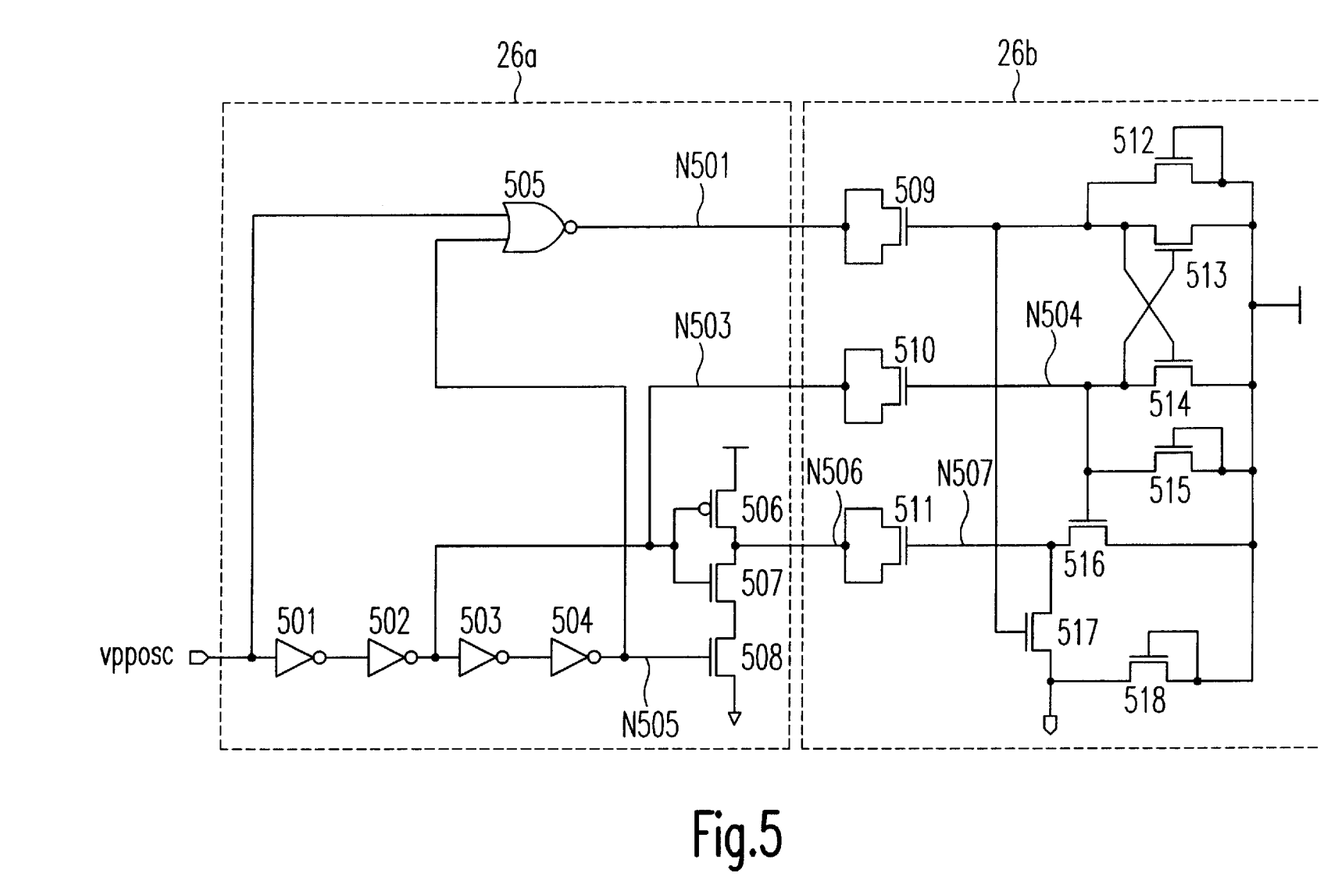
FIG. 5 is a circuit diagram of a charge pump part in the high-voltage generating means of FIG. 1 in accordance with the present invention.

Charge pump 26 in high-voltage generating means 20, as shown in FIG. 5, includes a control part 26a which provides a timing set necessary in a pump part 26b by the use of a signal vpposc output from ring oscillator 24, and pump part 26b that performs a pumping operation by the timing set from control part 26a and produces high voltage Vpp.

Control part 26a includes a plurality of inverters 501, 502, 503 and 504 serving as time delay means and connected in series to output terminal vpposc of ring oscillator 24; a NOR gate 505 which performs a NOR operation with respect to output signal vpposc of ring oscillator 24 and an output signal of inverter 504; a PMOS transistor 506 and an NMOS transistor 507 interposed between power supply and ground and each having a gate terminal commonly connected to an output terminal of inverter 502; and an NMOS transistor 508 disposed between ground and a source terminal of NMOS transistor 507 and having a gate terminal connected to an output terminal of inverter 504.

Pump part 26b includes an NMOS diode and an NMOS transistor 513 connected to each other in parallel between NOR gate 505's output terminal N501 and power supply via capacitor 509; an NMOS transistor 514 connected between an output terminal N503 of inverter 502 and power supply via capacitor 510 and cross-connected with NMOS transistor 513; an NMOS transistor 515 connected in parallel with NMOS transistor 514; an NMOS transistor 516 connected between PMOS transistor 506's output terminal N506 and power supply via capacitor 511, and having a gate terminal connected to a node N504 between capacitor 510 and NMOS transistor 514; an NMOS transistor 517 connected between node N507 of capacitor 511 and NMOS transistor 516 and a high voltage output terminal vpp, and having a gate terminal connected to a node N502 between capacitor 509 and NMOS transistor 513; and an NMOS diode 518 connected between NMOS transistor 517's source terminal and power supply.

Figure 6:
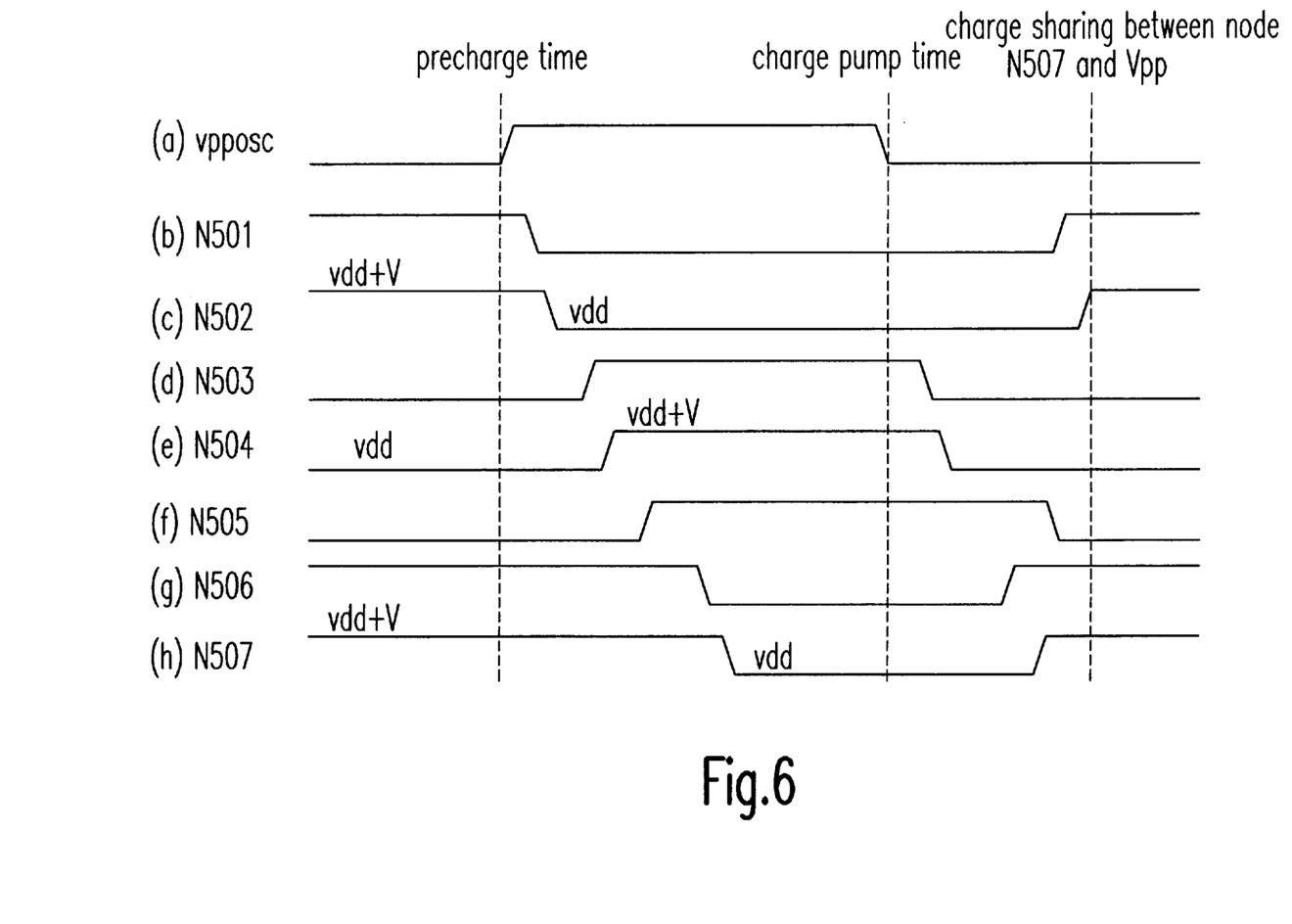

Referring to FIG. 6, the operation of charge pump 26 will be described as follows. In this preferred embodiment, an output signal vpposc from ring oscillator 24 is applied to charge pump 26 in case of a repair chip. Once output signal vpposc of ring oscillator 24 is changed to logic "high" from logic "low" for precharging charge pump 26 as shown in FIG. 6A's precharge timing set, 2-input NOR gate 505's output part(i.e. N501) is converted to logic "low" from logic "high".

As shown in FIG. 6c, opposite node N502 of capacitor 509 is changed to logic "high" (Vdd) from high voltage (Vdd+V) to turn off NMOS transistor 517, and node N503 is changed to logic "high" from logic "low" in a given period of time via inverters 501 and 502, as shown in FIG. 6d so opposite node N504 of capacitor 510 is changed to "high voltage (Vdd+V) from logic "high", thus turning on NMOS transistor 516.

Node N505 is delayed for a given period of time and changed to logic "high" from logic "low" through inverters 503 and 504, as shown in FIG. 6f to turn on NMOS transistor 508, and as shown in FIG. 6g, node N506 is converted to logic "low" from logic "high" so capacitor 511's opposite node N507 is changed to logic "high" from "high voltage (Vdd+V)", thus completing the precharging operation of charge pump 26.

As shown in FIG. 6a, if ring oscillator 24's output signal vpposc is converted to logic "low" from logic "high" for the charge pumping operation of charge pump 26, node N503 is delayed for a given period of time via inverters 501 and 502, as shown in FIG. 6d, and converted to logic "low" from logic "high". Accordingly, capacitor 510's opposite node N504 is converted to logic "high" from "high voltage" (Vdd+V) to turn off NMOS transistor 516, as shown in FIG. 6e.

As ring oscillator 24's output signal vpposc attains a low level, PMOS transistor 506 is turned on so node N506 is changed to logic "high" from logic "low" as shown in FIG. 6g, and capacitor 511's opposite node N507 is changed to "high voltage" (Vdd+V) from logic high, as shown in FIG. 6h. Node N505 is delayed for a given period of time via inverters 503 and 504, and as shown in FIG. 6f, it is converted to logic "low" so 2-input NOR gate 505's output terminal N501 is changed to logic "high" from logic "low".

Capacitor 509's opposite node N502 is changed to "high voltage" (Vdd+V), as shown in FIG. 6c. NMOS transistor 517 is turned on so charge sharing between node N507 and charge pump 26's output terminal vpp is made to complete boosting operation at final output vpp. If the potential of final output vpp is sufficiently boosted to high voltage by the repetition of the above operation, ring oscillator's output signal vppose does not generate a periodic pulse signal so charge pump 26 does not perform the pumping operation.

Figure 7:
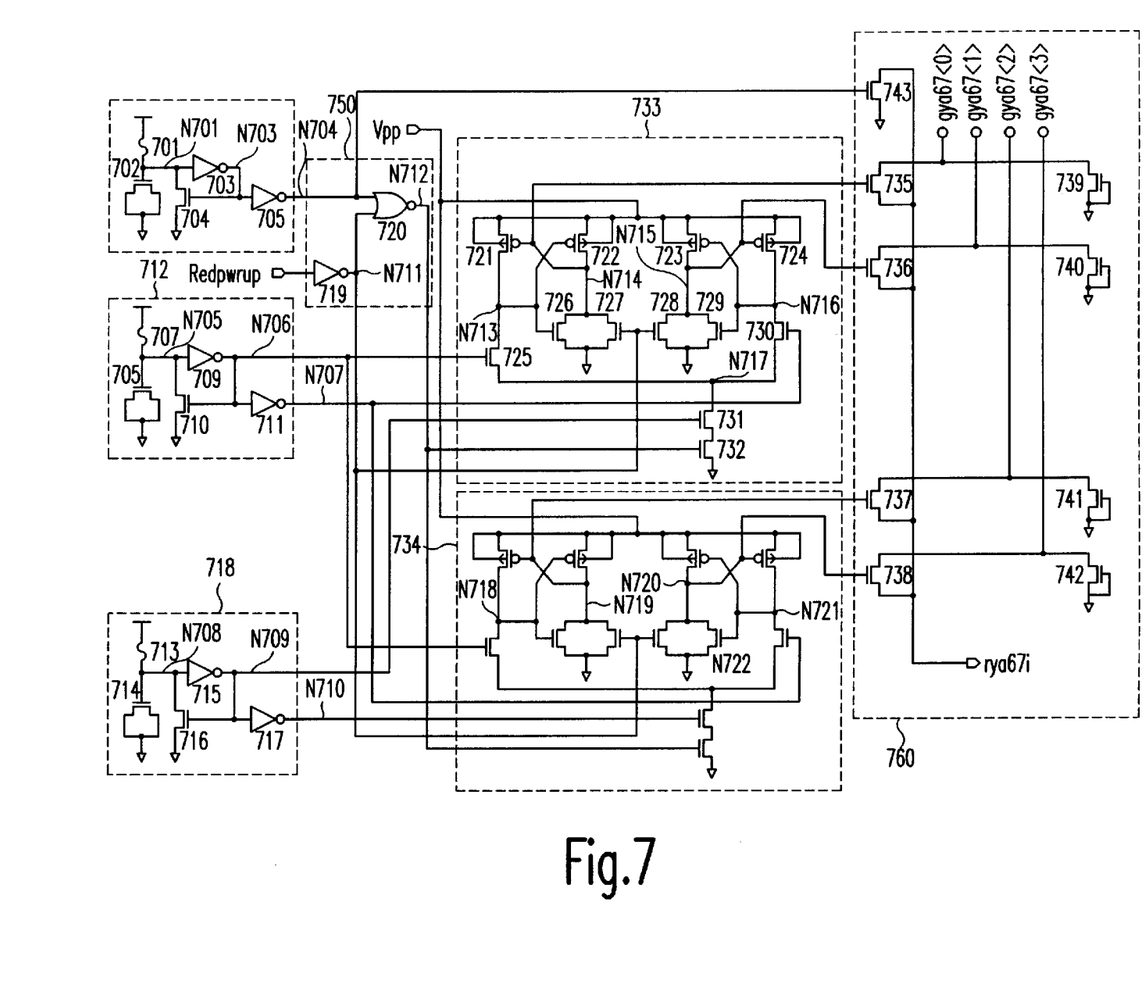
FIG. 7 is a circuit diagram of a redundant decoder in an on-chip redundant decoder of FIG. 1.

If charge loss occurs at charge pump 26's output node vpp in a given period of time, the potential of output node vpp is decreased, and output signal vpposc of ring oscillator 24 is periodically produced to repeat the above operation. This is omitted in FIGS. 6a to 6h, and in case of a normal chip ring oscillator 24's output signal vpposc is set to logic "low" to turn on NMOS transistor 517. Only NMOS diode 518 interposed between power supply and charge pump 26's output terminal vpp is turned on so the potential of charge pump 26's output terminal vpp is set to "Vdd−Vt". FIG. 7 is a circuit diagram of a redundant decoder (e.g.30a) within on-chip redundant decoding means 30. Redundant decoder 30a includes three fuse program meanss 706, 712 and 718; a control signal part 750 which synthesizes an enable signal of fuse program means 706 and "Redwrup"; level shifters 733 and 734; and an output part 760. Three fuse program meanss 706, 712 and 718 are the same as each other in structure, and the internal structure of fuse program means 706 only is described. Fuse program means 706 includes a fuse 701 and a capacitor 702 connected in series between vdd and ground; a first inverter 703 and a second inverter 705 connected between fuse 701 and capacitor 702; and an NMOS transistor 704 interposed between node N701 of fuse 201, capacitor 202 and first inverter 703 and ground. A fuse condition detecting signal is output through second inverter 705's output terminal N704. The fuse condition detecting signal output through output terminal N704 of second inverter 705 is a global enable signal of a redundant column predecoder (i.e. redundant decoder 30a), and if a normal column is used, the precharged state of final output (rya67i) (i.e. an NMOS transistor 743 is turned on to make rya67i logic "low") is created and a disabling signal (node 712 is in logic "low") of level shifters 733 and 734 is produced. Fuse program meanss 712 and 718 produce complementing signals (nodes N706, N707, N709 and N710), and level shifters 733 and 734's address input is provided.

Control signal 750 includes an inverter 719 inverting Redwrup; and a NOR gate 720 having an input terminal connected to fuse program means 706's output terminal N704 and inverter 719's output terminal N711, and performing a NOR operation of their input signals. Level shifters 733 and 734 are the same as each other in internal construction, and the internal construction of level shifter 733 only is described. Level shifter 733 includes a plurality of PMOS transistors 721, 722, 723 and 724 each having a source terminal connected to an output signal terminal vpp of charge pump 26 and connected to apply its output signal vpp as bulk voltage; an NMOS transistor 725 having a drain terminal connected to PMOS transistor's source terminal and a gate terminal connected to an output terminal (node N706) of fuse program means 712; a plurality of NMOS transistors 726 and 727 interposed between PMOS transistor 722 and ground and having a drain and a source connected to each other's; NMOS transistors 728 and 729 interposed between PMOS transistor 723 and ground and having a drain and a source connected to each other's; an NMOS transistor 730 having a drain connected to PMOS transistor 724's source and a gate terminal connected to an output terminal (node N707) of fuse program means 712; an NMOS transistor 731 having a gate terminal connected to fuse program means 718's output terminal (node N709) and a drain connected to NMOS transistors 725 and 730's source (node N717); and an NMOS transistor 732 having a gate terminal connected to an output terminal (node N712) of control signal part 750 and interposed between NMOS transistor 731 and ground. PMOS transistor 721's gate terminal is connected to PMOS transistor 722's drain (node N714), and PMOS transistor 722's gate terminal is connected between PMOS transistor 721's drain, NMOS transistor 725's drain (node N713), and NMOS transistor 726's gate terminal.

PMOS transistor 724's gate terminal is connected between PMOS transistor 723's drain (node N715), and PMOS transistor 723's gate terminal is connected between PMOS transistor 724's drain, NMOS transistor 730's drain and NMOS transistor 729's gate terminal. NMOS transistor 727's gate terminal is connected to NMOS transistor 728's gate terminal, and is commonly connected to an output terminal (node N711) of inverter 719 forming control signal part 750.

Output part 760 includes an NMOS transistor 735 connected between a terminal of a normal predecoding input signal (gya67<0>) of normal predecoding input signal (gya67<3:0>) and final output terminal rya67i, and having a gate terminal connected to node N714; an NMOS transistor 736 connected between a terminal of a normal predecoding input signal (gya67<1>) of normal predecoding input signal (gya67<3:0>) and final output terminal rya67i, and having a gate terminal connected to node N715; an NMOS transistor 737 connected between a terminal of a normal predecoding input signal (gya67<2>) of normal predecoding input signal (gya67<3:0>) and having a gate terminal connected to node N719 of level shifter 734; an NMOS transistor 738 connected between a terminal of a normal predecoding input signal (gya67<3>) of normal predecoding input signal (gya67<3:0>) and having a gate terminal connected to node N720 of level shifter 734; an NMOS transistor 743 connected between final output terminal rya67i and ground and having a gate terminal connected to an output terminal (node N704) of fuse program means 706; and a plurality of NMOS transistors 739, 740, 741 and 742 of reverse diode type each connected between a terminal of normal predecoding input signal (gya67<3:0>) and ground.

NMOS transistor 743 maintains a precharge potential (e.g. ground potential) as to final output signal rya67i at the time of the normal column operation. NMOS transistors 739, 740, 741 and 742 prevent each normal predecoding input signal gya67<3:0>from having an excessive negative potential.

In the operation of redundant decoder 30a, when a repair chip ("Redpwrup" signal attains a logic "low") is in standby, as NMOS transistors 727 and 728, each having a gate terminal connected to node N711 of control signal part 750, are turned on, each of nodes N714 and N715 of level shifter 733 attains a ground potential.

As PMOS transistor 721 having a gate terminal connected to node N714 is turned on, node N713 maintains a Vpp potential (about 1.5 Vcc), and as PMOS transistor 724 having a gate terminal connected to node N715 is turned on, node N716 maintains a Vpp potential (about 1.5 Vcc). At this point, NMOS transistors 725 and 730 are turned off, and a fuse programmable address and a global enable signal (i.e. node N712) are applied to each gate terminal of NMOS transistors 731 and 732 connected in series between node N717 and ground while PMOS transistors 722 and 723 are being turned off, and NMOS transistors 726 and 729 are being turned on.

When activating a repair chip, one of signals precharged by Vpp potential is discharged to node N713 and node N716 as NMOS transistors 725 or 730, 731 and 732 are turned on, and one of output nodes N714 and N715 rises to Vpp potential, thus completing the decoding operation. After decoding, as one of a plurality of NMOS transistors 735, 736, 737 and 738, constituting output part 760, is turned on, a corresponding normal predecoding input signal is transmitted to final output rya67i.

The following description relates to the redundant circuit for a semiconductor device in accordance with the present invention.

Once the power supply voltage is applied to the circuit, fuse program means 10 provides a complementing signal enb according to fuse blowing, and high-voltage generating means 20 transmits a voltage level of signal vpp corresponding to a normal chip or repair chip. On-chip redundant decoding means 30 generates an output signal in response to signal vpp or repaired address.

An output signal enb of fuse program means 10 in case of a normal chip attains a low level since a fuse blowing is not made. Even if the power supply voltage is applied, high-voltage level detector 22 of high-voltage generating means 20 maintains the state of enabling charge pump 26, i.e. makes signal vppdet attain a high level. Sensing part 22a of differential amplifier type in high voltage level detector 22 shuts off the current pass under the control of signal enb, and ring oscillator 24 does not produce a pulse signal under the control of signal enb. As the power supply voltage is applied, signal vpp maintains the voltage level Vcc−Vt precharged at node vpp.

On-chip redundant decoding means 30 shuts off a predecoded address pass since fuse blowing is not made, and enable signals of redundant decoder 30a to 30n are disabled so the level of voltage (Vcc−Vt), precharged at node vpp, is maintained when the power supply voltage is applied.

On the contrary, in case of a repair chip, since fuse blowing is made, output signal enb of fuse program means 10 attains a high level, and once the power supply voltage is applied, high-voltage level detector 22 enables charge pump 26, i.e. signal vppdet attains a high level. Accordingly, ring oscillator 24 produces a pulse signal vpposc when signal vppdet attains a high level.

When the power supply voltage is applied, the level of voltage (Vcc−Vt) precharged at node vpp rises to a level of high voltage (1.5 Vcc) by charge pump 26, and keeps high under the control of high-voltage level detector 22.

The high voltage Vpp generated in this manner, drives on-chip redundant decoding means 30, and one of redundant decoders 30a to 30n receives a predecoded address according to an address selection mechanism generated by another fuse program.

As described above, in case of a normal chip, the present invention may lower the power consumption during standby by disabling the already used high-voltage generating means, and assures the memory performance with the low power consumption.

Therefore, it should be understood that the present invention is not limited to the particular embodiment disclosed herein as the best mode contemplated for carrying out the present invention, but rather that the present invention is not limited to the specific embodiments described in this specification except as defined in the appended claims.

What is claimed is:

1. A redundant circuit for a semiconductor device, comprising:
   a) fuse program means for producing a control signal indicating whether a chip is normal or abnormal;
   b) high-voltage generating means for producing, in accordance with the control signal:
      1) a first voltage responsive to a logic high indication, when the chip is normal, and
      2) a second voltage that is higher than the first voltage, when a memory cell in the chip has failed so as to render the chip abnormal;
      said high-voltage generating means including,
         a high-voltage level detector for sensing a voltage level of a voltage produced by the high-voltage generating means;
         a ring oscillator for receiving a signal output from the high-voltage level detector and for producing an oscillation signal;
         a charge pump for generating the second voltage in response to the oscillation signal; and
   c) on-chip redundant decoding means, driven by the first voltage or the second voltage, for providing an output that selects a redundant memory cell.

2. A redundant circuit for a semiconductor device, comprising:
   fuse program means for producing a control signal indicating whether a chip is normal or abnormal;
   high-voltage generating means for producing, in accordance with the control signal, a first voltage when the chip is normal, and a second voltage that is higher than the first voltage when the chip is abnormal, said high-voltage generating means including:
      a high-voltage level detector for sensing a voltage level in response to the control signal output from the fuse program means;
      a ring oscillator for receiving a signal output from the high-voltage level detector to produce an oscillation signal;
      a charge pump for generating the second voltage in response to the oscillation signal; and
   on-chip redundant decoding means, driven by the first voltage or the second voltage produced by the high-voltage generating means.

* * * * *